United States Patent [19]
Kirk et al.

[11] Patent Number: 5,663,785
[45] Date of Patent: Sep. 2, 1997

[54] DIFFRACTION PUPIL FILLER MODIFIED ILLUMINATOR FOR ANNULAR PUPIL FILLS

[75] Inventors: Joseph Pennell Kirk, Dutchess County, N.Y.; Ronald Michael Martino, Fairfield County, Conn.

[73] Assignee: International Business Machines Corporation, Armonk, N.Y.

[21] Appl. No.: 448,691

[22] Filed: May 24, 1995

[51] Int. Cl.$^6$ .................. G03B 27/72; G03B 27/68; G03B 27/52

[52] U.S. Cl. .................. 355/71; 355/52; 355/55

[58] Field of Search .................. 355/53, 71, 67, 355/55, 75

[56] References Cited

U.S. PATENT DOCUMENTS

| | | | |
|---|---|---|---|
| 4,933,714 | 6/1990 | Buckley et al. | 355/43 |
| 5,418,598 | 5/1995 | Fukuda et al. | 355/66 |
| 5,440,426 | 8/1995 | Sandstrom | 359/559 |

*Primary Examiner*—Arthur T. Grimley
*Assistant Examiner*—Herbert V. Kerner
*Attorney, Agent, or Firm*—Whitham, Curtis, Whitham & McGinn; Charles W. Peterson, Jr.

[57] ABSTRACT

Uniform illumination of a photomask in optical lithography is achieved with annular illumination of the conjugate pupil plane in a lithography tool. A spinning diffraction filter is placed in a stepper so as to provide annular illumination on a time averaged basis. This approach provides annular illumination for resolution enhancement in an easily manufacturable and flexible way and without significant loss of light intensity. No illuminator redesign in the photolithographic exposure tool is required.

5 Claims, 4 Drawing Sheets

1
DIFFRACTION PUPIL FILLER MODIFIED ILLUMINATOR FOR ANNULAR PUPIL FILLS

BACKGROUND OF THE INVENTION

1. Field of the Invention

The present invention generally relates to optical lithography useful for the manufacture of semiconductor integrated circuits and, more particularly, to economical and flexible diffraction techniques for annular illumination to achieve resolution enhancement in semiconductor manufacture.

2. Background Description

Optical lithography is widely used in the manufacture of semiconductor integrated circuits (ICs). An image of a pattern to be formed on a semiconductor substrate is projected at reduced scale on to the surface of the substrate which has been coated with a suitable photoresist. The optical system is typically incorporated in a step and repeat projector so as to pattern an entire semiconductor wafer in a series of indexed steps. Exposure and development of the photoresist is followed by the addition or removal of materials as, for example, by deposition or etching. In order to fabricate ICs of increased complexity while reducing feature size, it is important to improve the uniformity of the illumination and depth of focus of the image on the substrate.

Incorporation of alternate pupil fills requires major redesign of the illuminator system and results in limitations on pupil fill choices. These limitations include varying degradation of the illumination uniformity, modified distortion characteristics, and intensity loss with pupil fill choices. Typical solutions use filters that block most of the light from the illuminator or a rotating prism that provides one fixed type of off axis illumination.

Y. Oh et al. in "A New Mask Technique for Optical Lithography—Dummy Diffraction Mask", SPIE, Vol. 1927, Optical/Laser Microlithography VI, 1993, H. Kang et al., in "A New Method of Tilted Illumination Using Grating Mask; ATOM (Advanced Tilted Illumination on Mask)", SPIE, Vol. 1927, Optical/Laser Microlithography VI, 1993, and R. Pforr et al. in "New Resolution Enhancing Mask for Projection Lithography Based on In-situ Off Axis Illumination", SPIE, Vol. 1927, Optical/Laser Microlithography VI, 1993, have described techniques which minimized these limitations for dipole and quadrupole illumination through the use of diffraction grating; however, these papers do not describe diffraction techniques for annular illumination configurations.

R. Hollman in U.S. Pat. No. 5,359,388 describes a microlithographic projection system which uses a diffraction grating to eliminate the zeroth order for annular illumination; however, Hollman uses a kaleidoscope structure to replicate and overlap the diffracted orders which results in a complicated optical design.

SUMMARY OF THE INVENTION

It is therefore an object of the present invention to provide a diffraction technique for annular illumination configurations.

It is another object of this invention to improve optical efficiency and simplify illuminator design.

It is further object of the invention to provide an illuminator system for photolithographic applications capable of easily switching between annular and quadrapole illumination.

According to the invention, there is provided a spinning diffraction filter placed in a stepper so as to provide annular illumination on a time averaged basis. This approach provides annular illumination for resolution enhancement in an easily manufacturable and flexible way and without significant loss of light intensity. No illuminator redesign in the photolithographic exposure tool is required.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
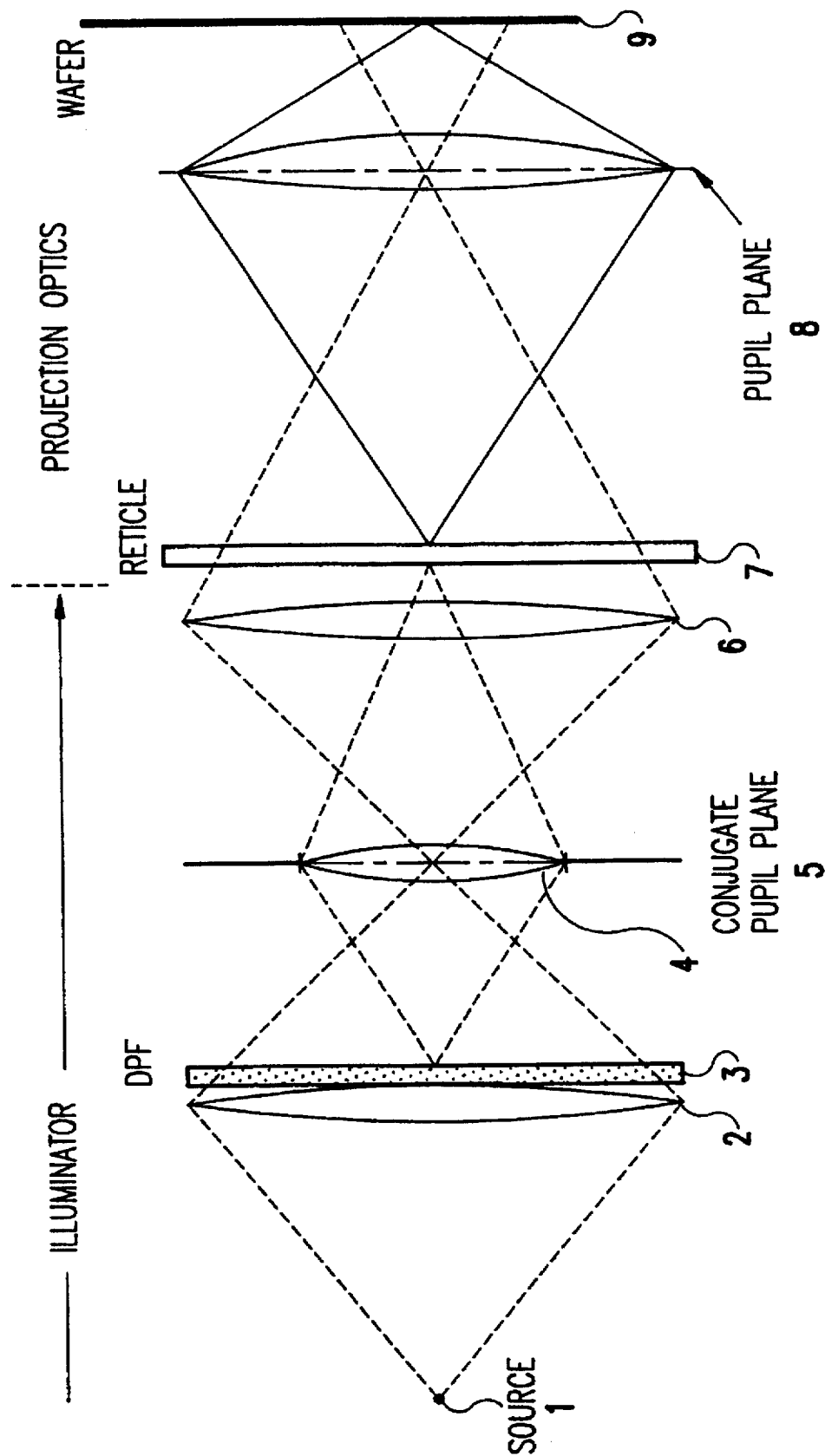
FIG. 1 is a schematic diagram of the illumination according to the present invention.

Referring now to the drawings, and more particularly to FIG. 1, there is shown a schematic diagram of illumination according to the present invention. The optics are divided into an illuminator portion and a projection portion. The illuminator portion illuminates a reticle, the image of which is to be projected onto a wafer. More specifically, a source 1 illuminates a first condenser lens 2 which diffracts light from the source 1 through the diffraction pupil filler (DPF) 3. The DPF 3 rotates to produce annular illumination of a second condenser lens 4 at the conjugate pupil plane 5. The lens 4 at the conjugate pupil plane 5 images the reticle or photo mask 7, evenly illuminating the reticle 7. A third condenser lens 6 over the reticle 7 focuses light on the projection lens 8 at the pupil plane, and the projection lens 8, in turn, focuses light on the semiconductor substrate or wafer 9 for patterning. The projection lens 8 acts to reduce the image of the photomask 7, thereby creating very fine patterning of a photoresist on the wafer 9.

Annular illumination is achieved according to the invention by incorporating the rotating diffraction pupil filler (DPF) 3 in the illuminator optics. The DPF 3 rotates during wafer exposure. The pupil filler is inserted perpendicular to the optical axis of the stepper (not shown). The DPF 3 is rotated such that $\theta/360 \times \text{rpm} \ll \text{Exposure time}$, where $\theta$ is the angle formed between two neighboring diffracted orders and rpm is the velocity of the pupil filler in revolutions per millisecond.

The basic illuminator is designed to give uniform image illumination and centrally illuminated pupil, as is the conventional illuminator found in all optical lithography tools. Since the diffracted images are replicas of the central pupil illumination, they are equally illuminated and maintain the initial illumination uniformity. When averaged through the rotation of the pupil filler 3 to produce the annulus, uniformity equal to or better than the original setup is obtained.

Deep Ultra Violet (DUV) laser illuminator systems are simplified by use of a dynamic coherent optical system where the DPF 3 generates the rotating virtual source, as described by D. Cronin et al. in "Dynamic Coherent Optical System", *Opt. Eng.* 12(2), pp. 50–55 (1973), and D. Cronin et al. in "Equivalence of Annular Source and Dynamic Phase Contrast Viewing System", *Opt. Eng.* 15(3), pp. 276–279 (1976). Various coherence functions are achieved by using different combination of diffracting pupil fillers.

Figure 2:
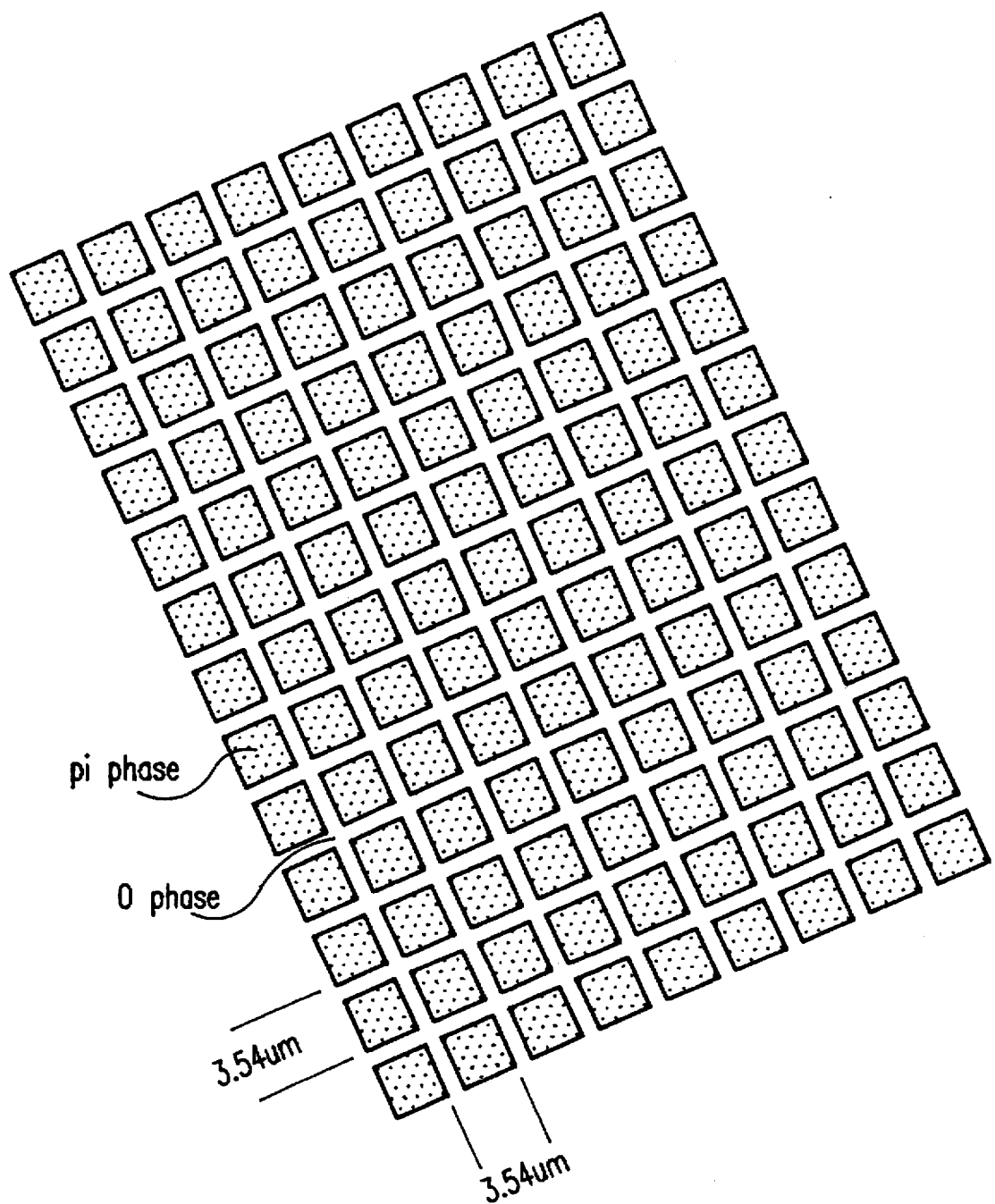
FIG. 2 is a diffraction pupil filler having a diamond pattern.
Figure 3:
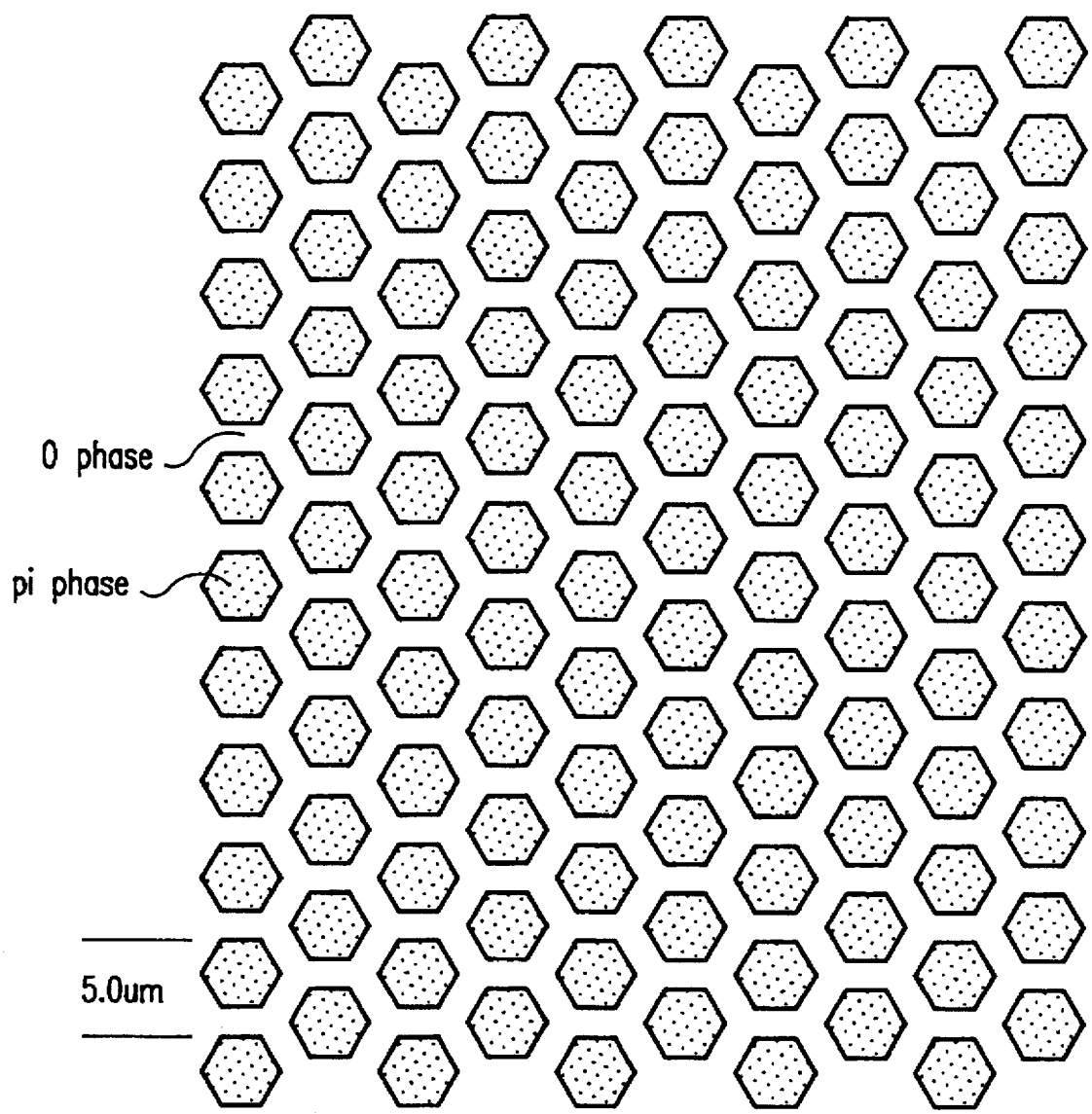
FIG. 3 is a diffraction pupil filler having a hexagonal pattern.
Figure 4A:
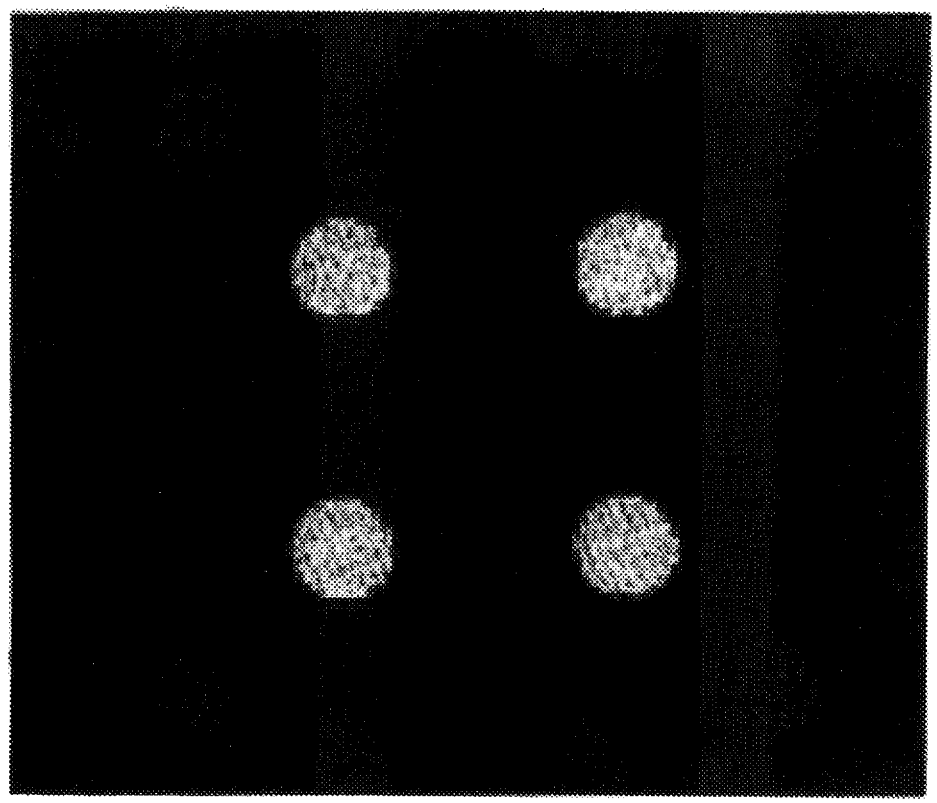
FIG. 4A is a quadrupole illumination produced by a diamond DPF or a checkerboard DPF.
Figure 4B:
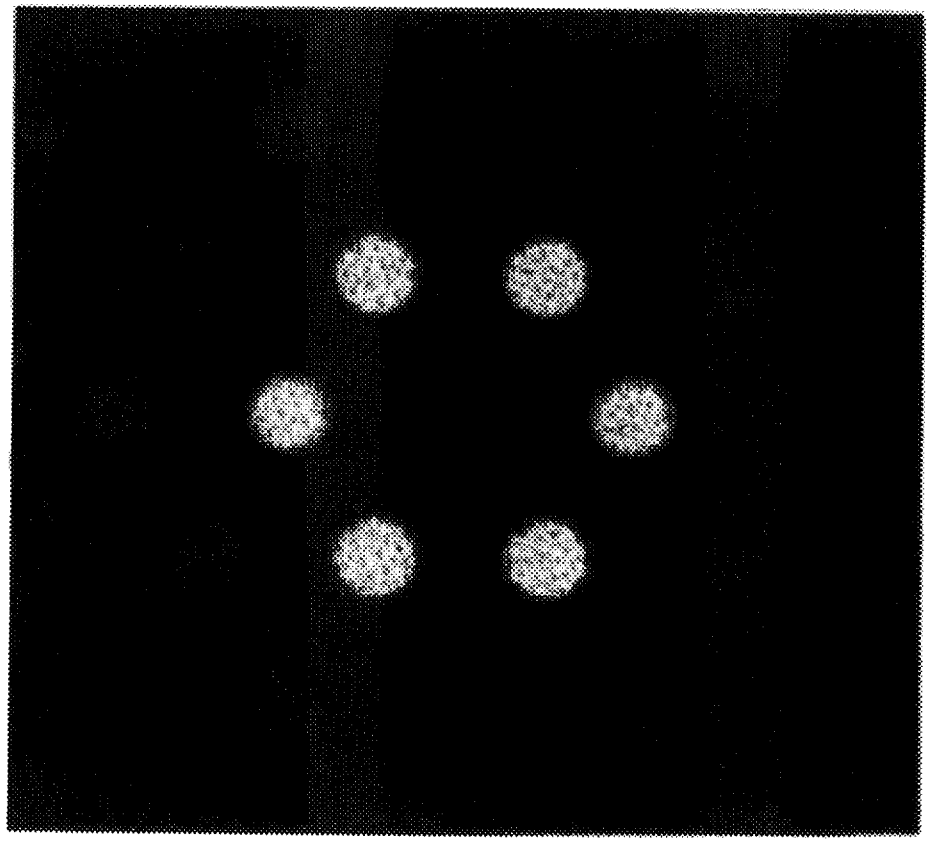
FIG. 4B is an illumination produced by a hexagonal DPF.

The diffraction pupil filler is designed with one of several phase patterns. In the preferred embodiment of the invention, these patterns are a checkerboard, a diamond or a hexagonal pattern. The checkerboard pattern has been described by Y. Oh et al., H. Kang et al., and R. Pforr et al., supra. The diamond and hexagonal patterns, shown in FIGS. 2 and 3, are unique. Both the diamond and checkerboard patterns produce a quadrupole illumination as shown in FIG. 4A, with the hexagonal pattern producing six replicas of the central pupil illumination as shown in FIG. 4B. The experimental results shown in FIGS. 4A and 4B were obtained using the Aerial Image Measurement System. Both the diamond and hexagonal patterns are shown with the zeroth diffracted order eliminated. A benefit of using the hexagonal pattern is a lower minimum rotational velocity due to the smaller angle between pupil replicas.

FIGS. 4A and 4B show examples of patterning which would occur at the conjugate pupil plane 5 of FIG. 1 if the DPF 3 were not spinning. The light pattern of FIG. 4A is produced by a DPF having the diamond pattern as shown in FIG. 2. FIG. 4B shows the light pattern produced by the hexagonal pattern as shown in FIG. 3. If a DPF were not added to the apparatus, the image at the pupil plane would be a single bright spot the same size as the spots produced in FIGS. 4A and 4B. The single bright spot does not provide for uniform illumination of the photomask, which in turn does not produce uniform patterning of the wafer 9. With the DPF spinning, the patterns of FIGS. 4A and 4B become annular at the conjugate pupil plane 5. Annular illumination at the pupil plane can be diffracted to produce uniform illumination on the photomask and uniform patterning on the wafer.

Centration of the annulus formed with the diffraction pupil fill is assured due to the physics of the diffraction. Translation of the pupil filler during rotation has no impact on the angle of diffraction. The angle is dependent on filler pitch, incident wavelength, and incident light position.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of uniformly exposing a wafer comprising the steps of:

providing an illuminator having a reticle to be imaged on the wafer;

providing a diffraction pupil filler within and perpendicular to an optical axis of said illuminator, said diffraction pupil filler having a predetermined diffraction pattern;

rotating the diffraction pupil filler such that
   $\theta/360 \times rpm << $ Exposure time, where $\theta$ is the angle formed between two neighboring diffracted orders and rpm is the velocity of the pupil filler in revolutions per millisecond, thereby annularly illuminating a conjugate pupil plane above said photomask and evenly illuminating said reticle; and projecting an image of said evenly illuminated reticle onto the wafer.

2. A photolithographic exposure system for uniform exposing a wafer comprising:

an illuminator having a reticle to be imaged on the wafer;

a diffraction pupil filler within and perpendicular to an optical axis of said illuminator, said diffraction pupil filler having a predetermined diffraction pattern;

means for rotating the diffraction pupil filler such that
   $\theta/360 \div rpm << $ Exposure time, where $\theta$ is the angle formed between two neighboring diffracted orders and rpm is the velocity of the pupil filler in revolutions per millisecond, thereby annularly illuminating a conjugate pupil plane above said photomask and evenly illuminating said reticle; and projection optics for projecting an image of said evenly illuminated reticle onto the wafer.

3. A photolithographic exposure system as in claim 2 wherein said means for rotating can be turned on and off, producing an annular illumination of a conjugate pupil plane when on and a quadrupole illumination of a conjugate pupil plane when off.

4. A photolithographic exposure system for uniform exposing a wafer comprising:

an illuminator having an illumination source and a reticle to be imaged on the wafer;

a diffraction pupil filler positioned between said illumination source and said reticle within and perpendicular to an optical axis of said illuminator said diffraction pupil filler having, a predetermined diffraction pattern; and projection optics for projecting an image of said evenly illuminated reticle onto the wafer.

5. A photolithographic exposure system as in claim 2 wherein said predetermined diffraction pattern is selected from the group consisting of diamond, hexagon, and checkerboard.

* * * * *

UNITED STATES PATENT AND TRADEMARK OFFICE
CERTIFICATE OF CORRECTION

PATENT NO. : 5,663,785
DATED : September 2, 1997
INVENTOR(S) : Joseph Penndell Kirk, Ronald Michael Martino It is certified that error appears in the above-identified patent and that said Letters Patent is hereby corrected as shown below:

Correct Claim 2, Column 4, Line 22 as follows:
    change " + " to -- × --;

Signed and Sealed this

Twentieth Day of January, 1998

Attest:

BRUCE LEHMAN

*Attesting Officer*      Commissioner of Patents and Trademarks